United States Patent
Cao et al.

(10) Patent No.: US 6,218,033 B1
(45) Date of Patent: Apr. 17, 2001

(54) MAGNETIC RECORDING MEDIA HAVING CRTIX UNDERLAYERS TO REDUCE CIRCUMFERENTIAL/RADIAL ANISOTROPY AND METHODS FOR THEIR PRODUCTION

(75) Inventors: Wei Cao, Fremont; James Ward, Sunnyvale; Mike Tregoning, Milpitas; Xingbo Yang, Pleasanton, all of CA (US)

(73) Assignee: Akashic Memories Corporation, San Jose, CA (US)

( * ) Notice: Subject to any disclaimer, the term of this patent is extended or adjusted under 35 U.S.C. 154(b) by 0 days.

(21) Appl. No.: 08/780,381

(22) Filed: Jan. 8, 1997

Related U.S. Application Data

(60) Provisional application No. 60/012,312, filed on Feb. 26, 1996.

(51) Int. Cl.[7] .................................................. G11B 5/66
(52) U.S. Cl. ............................ 428/694 T; 428/694 TS; 428/694 TR; 428/694 SG; 428/900; 427/128; 427/129; 427/130; 204/192.2
(58) Field of Search .................. 428/694 T, 694 TS, 428/694 TR, 694 SG, 900; 427/128–130; 204/192.2

(56) References Cited

U.S. PATENT DOCUMENTS

| | | | |
|---|---|---|---|
| 4,698,251 | 10/1987 | Fukuda et al. | 428/65.7 |
| 4,814,921 | * 3/1989 | Hamakawa | 360/126 |
| 4,833,020 | * 5/1989 | Shiroishi | 428/336 |
| 4,883,711 | 11/1989 | Shiroishi et al. | 428/336 |
| 4,939,614 | 7/1990 | Shirakura et al. | 360/135 |
| 4,996,622 | 2/1991 | Takatsuki et al. | 360/135 |
| 5,113,302 | 5/1992 | Shimizu et al. | 360/135 |
| 5,302,434 | 4/1994 | Doerner et al. | 428/65.6 |
| 5,388,020 | 2/1995 | Nakamura et al. | 360/135 |
| 5,478,622 | 12/1995 | Nakamura et al. | 428/65.6 |
| 5,496,606 | 3/1996 | Mizukami | 428/65.3 |
| 5,523,173 | 6/1996 | Doerner et al. | 428/611 |
| 5,605,733 | 2/1997 | Ishikawa et al. | 428/65.3 |

OTHER PUBLICATIONS

Kataoka, Hiroyuki et al. "Magnetic and Recording Characteristics of Cr, Ta, W and Zr Pre-Coated Glass Disks," *IEEE Transactions on Magnetics* 31:6 Nov., 1995.

Shiroishi, Y. et al. "Magnetic Properties and Read/Write Characteristics of Co–Cr–(Pt,Ta)/(Cr–Ti,Cr) Thin Film Media," *Journal of Appl. Phys.* 73:10 May 15, 1993.

* cited by examiner

Primary Examiner—Leszek Kiliman
(74) Attorney, Agent, or Firm—Townsend Townsend & Crew LLP; Nena Bains, Esq.

(57) ABSTRACT

The present invention provides magnetic recording media comprising a rigid substrate and an underlayer disposed over the substrate, in which the underlayer comprises CrTiCu or CrTiV. A magnetic layer is disposed over this underlayer, and is also disposed over a texturized surface. Generally, the substrate comprises aluminum, and an NiP layer is disposed over the substrate and below the underlayer. The texture will typically be imposed on this NiP layer. Advantageously, the CrTiCu or CrTiV underlayer has been found to compensate for texture-induced anisotropy, limiting a ratio of circumferential coercivity to radial coercivity within the range between about 0.8 and 1.25.

15 Claims, 3 Drawing Sheets

MAGNETIC RECORDING MEDIA HAVING CRTIX UNDERLAYERS TO REDUCE CIRCUMFERENTIAL/RADIAL ANISOTROPY AND METHODS FOR THEIR PRODUCTION

CROSS-REFERENCE TO RELATED APPLICATION

This application is a continuation-in-part of and claims priority from U.S. Provisional Patent Application Ser. No. 60/012,312, filed Feb.26, 1996, the full disclosure of which is incorporated herein by reference.

BACKGROUND OF THE INVENTION

1. Field of the Invention

The present invention relates generally to magnetic recording media, and more particularly to high density magnetic recording disks having textured surfaces.

Thin film magnetic recording disks generally comprise a disk substrate having a magnetic layer and a number of underlayers and overlayers deposited thereon. The nature and composition of each layer is selected to provide the desired magnetic recording characteristics, as generally recognized in the industry. An exemplary present day thin film disk is illustrated in FIG. 1 and comprises a non-magnetic disk substrate 10, typically composed of aluminum or an aluminum alloy. An amorphous nickel-phosphorus (NiP) layer 12 is formed over each surface of the disk substrate 10, typically by plating. The NiP layer is hard, and imparts rigidity to the aluminum substrate. A second underlayer in the form of a chromium ground layer 14 is formed over the NiP layer 12, typically by sputtering, and a magnetic layer 16 is formed over the ground layer 14. The magnetic layer 16 comprises a thin film of a ferromagnetic material, such as a magnetic oxide or magnetic alloy. Usually, a protective layer 18, such as carbon film, is formed over the magnetic layer 16, and a lubricating layer 20 is formed over the protective layer.

The presence of the NiP layer 12 and the chromium ground layer 14 have been found to improve the recording characteristics of the magnetic layer 16. In particular, a chromium ground layer formed over a NiP layer has been found to provide enhanced coercivity and reduced noise characteristics. Additionally, the NiP layer is often mechanically textured to create a roughened surface prior to formation of the chromium ground layer. This surface texturing has a substantial effect on the mechanical properties of the disk and its interaction with the recording transducer (read/write head), which typically "flies" over the disk surface on a cushion of air that is moved by the rotating disk. In particular, texturizing is highly beneficial to the magnetic recording system's ability to reliably withstand repeated starting and stopping of the disk, with its associated repeated contact between the read/write head and the disk's surface. The texturing may be circumferential, crosswise, or separated into start/stop and data zones, with the preferred geometry depending on the particular composition of the cobalt-containing magnetic layer, and on the specific disk drive design.

Such magnetic recording constructions have been very successful and allow for relatively high recording densities. As with all successes, however, it is desired to provide magnetic recording disks having even higher recording densities. To increase recording densities beyond those of known practical magnetic recording media, it would be beneficial to minimize any anisotropy of the magnetic recording layer within the structure of the magnetic recording media.

Work in connection with the present invention has shown that anisotropy (here referring to differing circumferential and radial magnetic recording characteristics) may deteriorate certain electrical and magnetic parameters of high density magnetic recording media, such as the pulse width, the overwrite, the non-linear transition shift, and the signal-to-noise ratio. Specifically, scratches in the disk structure prior to deposition of the magnetic layer are a recognized source of magnetic recording defects. These defects are worsened by magnetic layer anisotropy, as the film stress along the scratch will tend to align the preferred magnetic orientation of a subsequent anisotropic magnetic layer with the direction of the scratch. Where the scratch has a radial orientation and the recording media has a circumferential orientation, the scratch produces a localized radial orientation of the magnetics, which will cause disk magnetic defects and missing pulses. Clearly, such defects should be minimized. Therefore, it is desirable to provide isotropic media (media having substantially equivalent circumferential and radial recording characteristics) to optimize magnetic recording densities.

Unfortunately, the texture imposed on the NiP-coated substrate to provide acceptable mechanical characteristics and reliability can also induce substantial anisotropy in the final magnetic recording media. This is the same effect as the scratch-induced localized anisotropy, only it occurs along a texture line, generally with a circumferential orientation. This texture-induced anisotropy, which can result in coercivities in the circumferential direction being twice the radial coercivity or more, typically requires a tradeoff between mechanical and magnetic recording characteristics. In other words, the texture-induced anisotropy of present magnetic recording media structures requires some compromise of either reliability or recording density.

For these reasons, it would be desirable to provide an improved magnetic recording disk which allowed optimization of the texture for mechanical properties, and which avoided the texture-induced anisotropy of known magnetic recording media. It would be particularly desirable if such isotropic textured media maintained the enhanced magnetic properties which are provided by known media structures. It would further be desirable if such improved magnetic recording media were readily fabricated using existing thin film deposition and texturing equipment, and provided the enhanced magnetic properties of recent cobalt-containing magnetic layers.

2. Description of the Background Art

The magnetic properties and read/write characteristics of CoCrPt and CoCrTa magnetic layers disposed over ground layers of Cr or CrTi were described by Y. Shiroishi et al. in the *Journal of Applied Physics*, Vol. 73, No. 10, p. 5569 (May 1993). The CrTi underlayer was found to enhance the inplane coercive forces of these specific cobalt-containing magnetic layers. The magnetic recording characteristics of glass disks having pre-coat layers of Cr, Ta, W, or Zr were described by Hiroyuki Kataoka et al. in IEEE *Transactions on Magnetics*, Vol. 31, No. 6, p. 2734 (November 1995). In particular, the magnetic and recording characteristics of a CoCrPt magnetic layer disposed over a CrTi ground layer, in turn disposed over the pre-coated glass disks, were compared, with the Ta pre-coated glass disk being preferred due to its relatively large output signal and relatively low noise.

U.S. Pat. No. 5,166,006 describes a method for selectively chemically etching a substrate to form an isotropic texture of a desired density and roughness. Selective texturing of specific zones of the substrate are also described. U.S. Pat. No. 5,302,434 describes a contact recording media having an NiO film between an NiP-coated substrate and Cr or CrV layer to increase the coercivity of a subsequent cobalt alloy magnetic layer. U.S. Pat. Nos. 5,388,020, 4,698,251, 4,996, 622, 5,478,622, and 4,939,614 describe textured recording media and methods for their production. U.S. Pat. No. 5,113,302 is generally relevant.

SUMMARY OF THE INVENTION

The present invention provides magnetic recording media comprising a rigid substrate and an underlayer disposed over the substrate, in which the underlayer comprises CrTiCu or CrTiV. A magnetic layer is disposed over this underlayer, and is also disposed over a texturized surface. Generally, the substrate comprises aluminum, and an NiP layer is disposed over the substrate and below the underlayer; the texture is typically imposed on this NiP layer. Advantageously, the CrTiCu or CrTiV underlayer has been found to compensate for texture-induced anisotropy of the recording media, limiting a ratio of circumferential coercivity to radial coercivity within the range between about 0.8 and 1.25, and in some cases, between about 0.95 and 1.10.

Preferably, the underlayer comprises Ti in the range between about 2 and 20%. When it is present, Cu will provide between about 2 and 6 atomic percent of the underlayer. Alternatively, the underlayer preferably comprises V in the range between about 5 and 25 atomic percent. In either case, the balance of the underlayer will ideally substantially comprise Cr. Such underlayers have been found to be particularly beneficial when combined with magnetic layers comprising either CoCrTa or CoCrTaPtY (Y being any of B, Ni, or W). Specifically, magnetic recording media having such structures have been found to be substantially isotropic, despite the presence of the textured surface below the magnetic recording layer. Additionally, the underlayers of the present invention have been found to improve overwrite and non-linear transition shift performance when compared to known underlayer materials.

In another aspect, the present invention provides a method for producing magnetic recording media, the method comprising texturizing a surface over a rigid substrate, wherein the substrate comprises a disk which defines a circumferential direction and a radial direction. An underlayer comprising CrTiX is then formed over the texturized surface, X comprising an element other than Cr and Ti. A magnetic layer is then formed over the underlayer, while the underlayer compensates for texture-induced anisotropy so that an orientation ratio of circumferential coercivity to radial coercivity of the recording media is in the range between about 0.8 and 1.25. Ideally, the orientation ratio is in the range between about 0.95 and 1.10. Typically, X comprises Cu or V. Oftentimes, the underlayer forming step will comprise sputtering from a sputtering source which is substantially composed of a material selected from the group consisting of CrTiCu and CrTiV. An NiP layer will often be formed over the substrate before the underlayer, and the texturizing step will often comprise imposing a texture on this NiP layer. Alternatively, the texture may be imposed on the substrate itself, or on some other layer disposed below the magnetic recording layer.

DESCRIPTION OF THE SPECIFIC EMBODIMENTS

Figure 1:
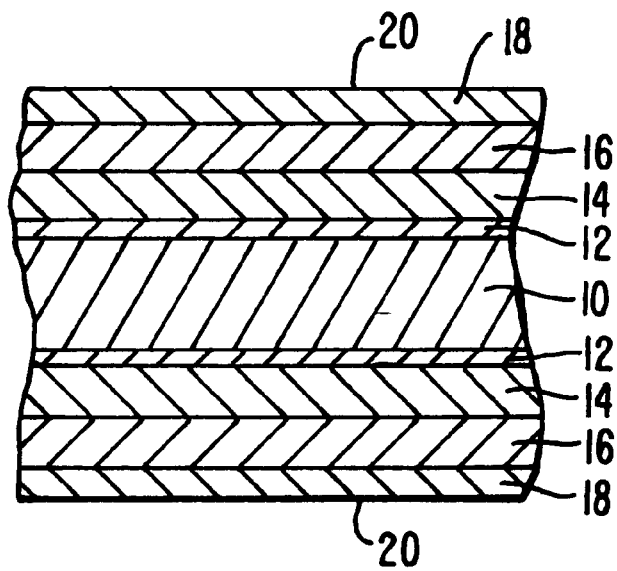
FIG. 1 is a cross-sectional view of an exemplary prior art magnetic recording disk, as described in the Background section hereinabove.
Figure 2:
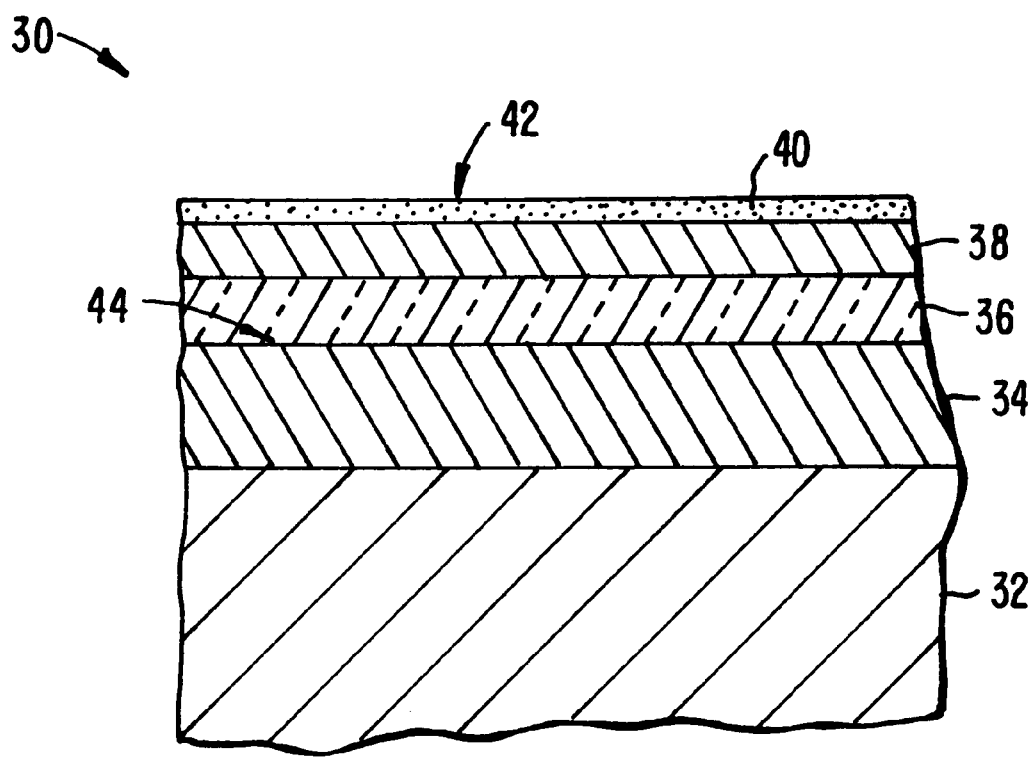
FIG. 2 is a cross-sectional view of a magnetic recording disk having a CrTi, CrTiCu, or CrTiV underlayer to avoid texture-induced anisotropy according to the present invention.

Referring now to FIG. 2, magnetic recording media according to the present invention will usually be in the form of a magnetic recording disk 30 comprising an aluminum alloy substrate 32, an NiP layer 34, an underlayer 36 (generally comprising chromium, titanium, and preferably either copper or vanadium) a magnetic layer 38, a protective layer 40, and a lubricating layer 42. The various layers will be formed over at least one surface of the substrate 32, and preferably over both surfaces of the substrate, analogous to the structure illustrated in FIG. 1. A textured surface 44 is disposed below magnetic layer 38, typically being imposed on the NiP layer 34.

Substrate 32 comprises a disk having a diameter and thickness suitable for formation of a conventional hard magnetic recording media. Typically, substrate 32 will be composed of aluminum or an aluminum alloy. Alternatively, nonmetallic substrates comprising glass, ceramic, carbon, glass-ceramic composites, glass-carbon composites, silicon, silicon carbide, and the like, may be used.

NiP layer 34 will preferably be formed over the surface of the substrate using conventional plating techniques, ideally by means of electroless plating. The NiP layer will be deposited to a thickness generally in the range from about 500 Å to 5000 Å. Alternatively, though not necessarily preferably, the NiP layer 34 may be formed using more expensive vacuum deposition techniques.

Once the NiP layer 34 has been formed over the substrate, the NiP layer can be mechanically textured in a conventional manner, often by means of tape or slurry abrasion. The type of texturing will depend, in part, on the nature of the magnetic alloy which is to be applied over NiP layer 34. For example, some magnetic alloys, such as cobalt chromium tantalum, benefit from circumferential texturing to achieve optimum coercivity and magnetic characteristics. Other magnetic alloys, including cobalt platinum chromium, are enhanced by alternative types of texturing. A particularly advantageous texture and a method for its production are described in co-pending U.S. patent application Ser. No. 08/503,785, now U.S. Pat. No. 5,798,164, the full disclosure of which is incorporated herein by reference. That exemplary texture comprises independently optimized texture zones for 1) data, and 2) read/write recording head contact.

Regardless of the specific texture utilized, imposition of surface texture 44 on NiP layer 34 is generally dictated by the mechanical requirements of the final recording media. Specifically, surface texture 44 has a large influence on the height at which the read/write flies above the magnetic recording media. This texture further influences the speed at which the read/write head begins to float, and at which point the read/write head will come back into contact with the media surface during the start/stop cycle. Furthermore, surface texture 44 has a profound impact on the frictional interaction between the read/write head and the media surface during both the start/stop cycle, and during any inadvertent contact which occurs while the disk is rotating. This frictional interaction, called "stiction," can have a substantial effect on the reliability of the disk drive system.

As more fully explained in U.S. Pat. No. 5,798,164, stiction performance generally requires imposition of some texture even for the data zone within zone textured magnetic recording media. Hence, zone textured media are not immune from texture-induced anisotropy, together with its corresponding degradation of magnetic recording densities.

To compensate for texture-induced anisotropy, the media of the present invention includes underlayer 36 disposed over the textured surface 44 and beneath the magnetic recording layer 38. Underlayer 36 comprises chromium, which generally enhances the magnetic properties of the subsequently applied magnetic layer by creating grain separation in the magnetic alloy.

Underlayer 36 further comprises titanium, which preferably makes up between about 2 and 20% of the underlayer by atomic percentage. The underlayer of the present invention also preferably includes at least one other element, generically referred to herein as "X". The atomic percentage and specific element X will generally be selected by comparing the crystalline lattice mismatch between the underlayer and the magnetic layer, and by minimizing the mismatch to minimize the anisotropy of the final magnetic recording media structure. Preferably, X comprises either copper or vanadium. Where copper is used, it will generally comprise between about 2 and 6% of the atomic percentage of the underlayer. Where X comprises vanadium, that element will make up about 5 and 25% of the atomic percentage of the underlayer. Preferably, underlayer 36 substantially comprises chromium, titanium, and either copper or vanadium, as such underlayers have been found to produce substantially isotropic recording media when combined with the preferred magnetic recording layers described below.

The magnetic layer 38 is applied over the underlayer 36, again typically by sputtering in a conventional manner. The magnetic layer will typically comprise CoCrPtB, CoPtCr, CoNiCr, or other cobalt-containing alloys. Preferably, magnetic layer 38 comprises CoCrTa or CoCrTaPtY, Y being any of B, Ni, and W. Advantageously, the anisotropy of such magnetic recording layers, when disposed over appropriately textured surfaces, have been substantially eliminated by the underlayers of the present invention. Furthermore, these magnetic recording layers have magnetic recording characteristics which are generally advantageous for high density recording media. Where alternative magnetic recording layers are used, some variation or modification to underlayer 36 may be used to achieve orientation ratios of approximately 1.0. The thickness of the magnetic layer 38 is not critical, typically being in the range from about 100 Å to about 1000 Å.

A protective layer 40 is next formed over the magnetic layer, typically being composed of carbon sputtered to a thickness in the range from about 50 Å to about 400 Å; a thickness of over 100 Å being slightly preferred. The protective layer will usually be coated with a lubricant layer 42, for example, a fluorinated polyether or the like, typically having a thickness in the range from about 10 Å to about 50 Å. An alternative protective overcoat and method for its deposition are described in co-pending U.S. patent application Ser. No. 08/761,336, filed Dec. 10, 1996, now U.S. Pat. No. 5,858,477, the full disclosure of which is incorporated herein by reference.

The following example is offered by way of illustration, not by way of limitation.
Experimental Conventional NiP-coated aluminum disk substrates were prepared with either a full surface texture or a zone texture, as described above. The textured disks were 95 mm in diameter and 30.5 mil thick. A series of direct comparisons between media structures having a CrTiX underlayer with similar media structures having a Cr underlayer or a CrCu underlayer were performed, generally on disks which had differing underlayers formed simultaneously on opposite sides of the disk. For example, disks were sputtered with a CrCu underlayer on an A-side, and simultaneously sputtered with a CrTiX underlayer on a B-side. The specific CrTiX underlayer used in the tests was CrTiCu, in which each of the Ti and Cu provided between 2.0–6.0% of the underlayer (all percentages being atomic percent).

A sputtering machine was set up to apply heat of between 0.7 and 2.0 kW to each side of the textured substrate. The underlayer was then sputtered at a pressure of between 4 and 10 mTorr, with a bias of between −100 and −300 volts. Sputtering of the underlayer was followed by sputtering of the magnetic layer at a pressure of 4 to 10 mTorr, also with a bias of between −100 and −300 volts. An initial carbon coating was sputtered over the magnetic layer in a 10.0–20.0% methane environment. The disks were then cooled and the remainder of the carbon layer was sputtered in a 10.0–30.0% $N_2$ environment.

Referring generally to FIGS. 3–6, disks having an underlayer of Cr, CrCu, or CrCuTi with an underlayer thickness of 800 Å were sputtered with a CoCrTaPtB magnetic layer to a thickness of 300 Å. To determine the effect of heat time on coercivity and orientation ratio, these disks were prepared with heat duration times between 16.0 and 24.0 seconds. The effects of the differing underlayer materials on overwrite and non-linear transition shift were also studied.

Figure 3:
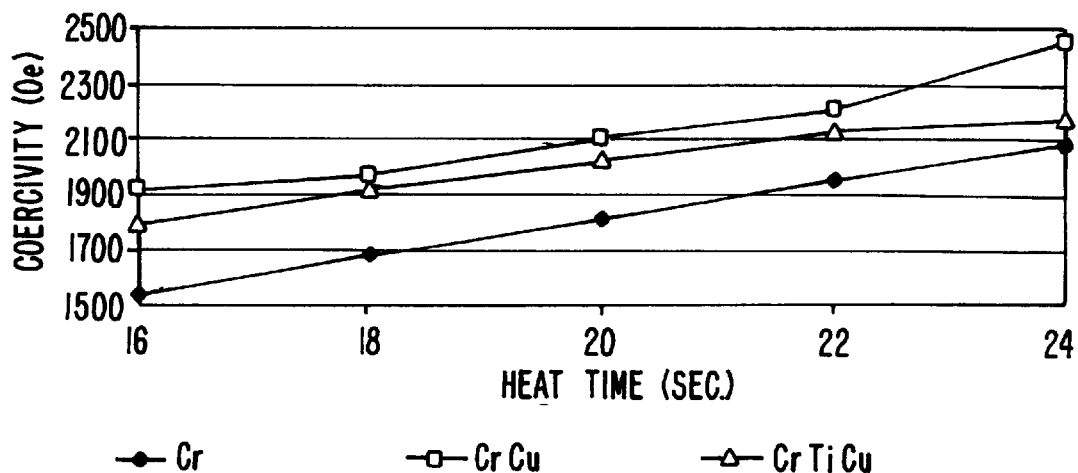
FIGS. 3–6 show experimental data, as described in detail in the Experimental section hereinbelow.
Figure 4:
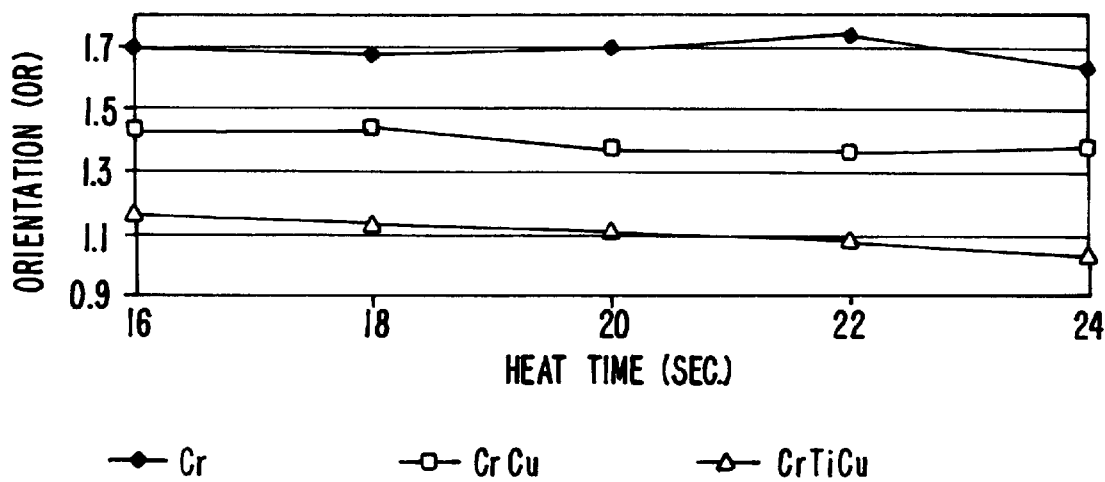

Referring now to FIGS. 3 and 4, the circumferential coercivity and orientation ratio were measured for disks having each of the three underlayers with heat times of 16.0, 18.0, 20.0, 22.0, and 24.0 seconds. As illustrated in FIG. 3, the coercivity of media having CrCuTi underlayers is comparable to that of media having underlayers of CrCu, and is substantially higher than that of media having underlayers of Cr, particularly at the intermediate heat times of between 18.0 and 22.0 seconds. However, the orientation ratio of the disks having CrTiCu is substantially lower than the other groups of disks, generally being between about 1.0 and 1.10, as seen in FIG. 4. It should be noted that all disks for which the data in FIG. 4 is illustrated have the same coercivity (Hc), the same remanent moment (MrT), and the same carbon overcoat thickness.

Figure 5:
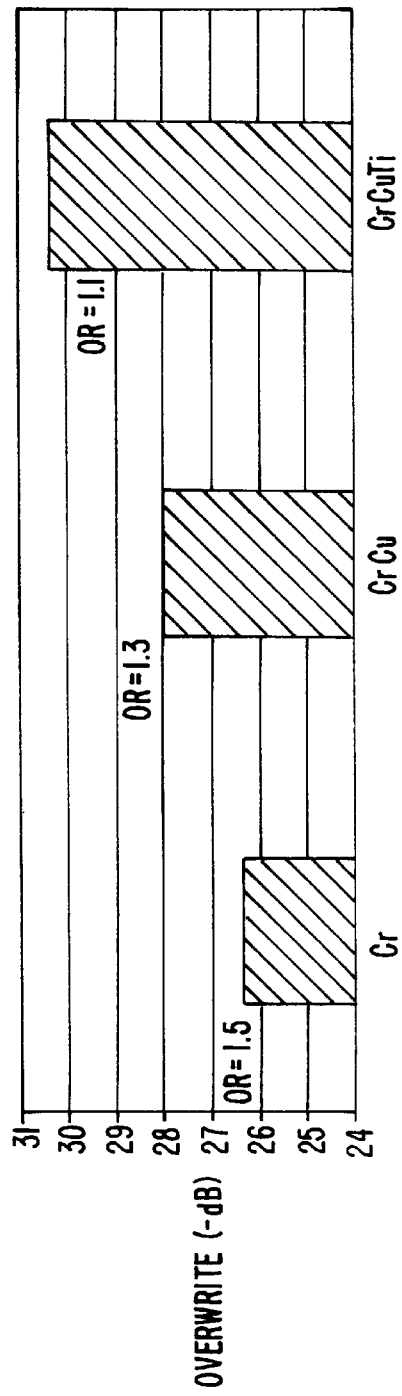
Figure 6:
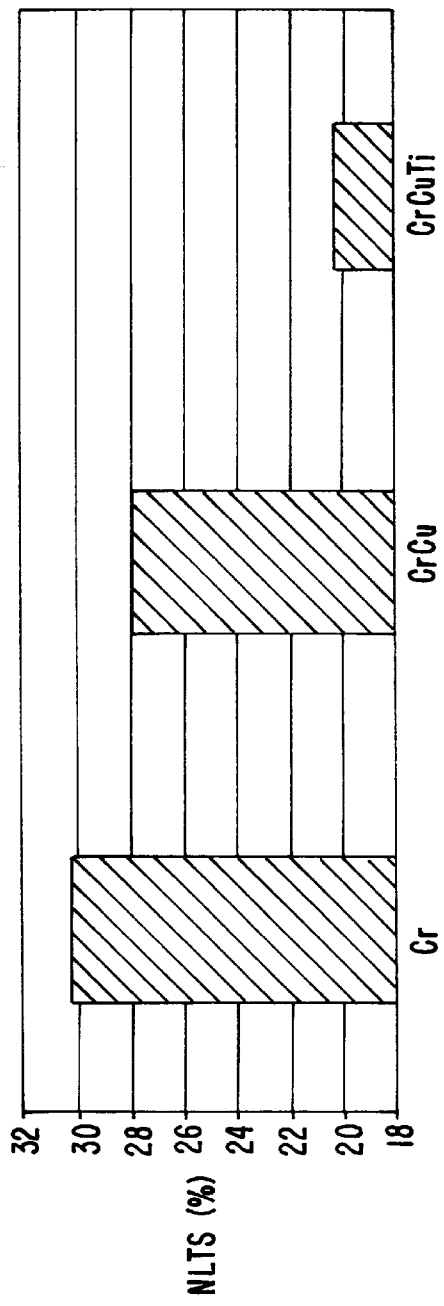

The effects of the differing underlayer materials on overwrite and non-linear transition shift performance are illustrated in FIGS. 5 and 6. These parametric measurements were performed using silmag Pseudo Contact Heads. As can be clearly seen from this data, CrTiCu showed a substantially enhanced overwrite and non-linear transition shift performance, as compared to the chromium and chromium copper underlayers, indicating that the CrTiX underlayer of the present invention provides not only a more isotropic media, but also provides enhanced magnetic recording characteristics for this magnetic recording media structure.

Finally, the effects of CrTiX and CrCu underlayers on magnetic recording media having magnetic layers of CoCrTa were compared for various magnetic layer thicknesses and the results are summarized in Table I.

TABLE I

|  | OR (CoCrTa = 25 nm) | OR (CoCrTa = 35 nm) | OR (CoCrTa = 45 nm) |
|---|---|---|---|
| CoCrTa/CrCu | 1.40 | 1.41 | 1.34 |
| CoCrTa/CrTiX | 1.05 | 1.05 | 1.06 |

Note that magnetic layer thicknesses are here given in nanometers, with the magnetic layer ranging between 25 and 45 nanometers in thickness. As can be seen, the CrTiX underlayer provides substantially and uniformly lower orientation ratios (OR) as compared to underlayers of CrCu, indicating that the CrTiX underlayer of the present invention also provides a substantially isotropic recording media with this alternative cobalt-containing alloy.

Although the foregoing invention has been described in some detail by way of illustration and example, for purposes of clarity and understanding, it will be obvious that certain changes and modifications may be practiced within the scope of the appended claims.

What is claimed is:

1. Magnetic recording media comprising:
   a rigid substrate;
   an underlayer disposed over the substrate, the underlayer comprising alloys selected from the group consisting of CrTiCu and CrTiV, the underlayer comprising Ti in the range between about 2% and 20% and either Cu in the range between about 2% and 6% or V in the range between about 5% and 25%; and
   a magnetic layer disposed over the underlayer, wherein the magnetic layer is disposed over a textured surface.

2. Magnetic recording media as in claim 1, wherein the substrate comprises aluminum.

3. Magnetic recording media as in claim 2, further comprising a layer including NiP disposed over the substrate and below the underlayer, wherein the textured surface is disposed under the underlayer.

4. Magnetic recording media as in claim 3, wherein the texturized surface is imposed on the NiP layer.

5. Magnetic recording media as in claim 1, wherein the substrate comprises a disk defining a circumferential direction and a radial direction, and wherein a ratio of circumferential coercivity to radial coercivity of the recording media is in the range between about 0.80 and 1.25.

6. Magnetic recording media as in claim 1, wherein the underlayer is substantially composed of CrTiCu.

7. Magnetic recording media as in claim 1, wherein the magnetic layer comprises a material selected from the group consisting of CoCrTaPtB, CoCrTaPtNi, and CoCrTaPtW.

8. Magnetic recording media as in claim 1, wherein the underlayer is substantially composed of CrTiV.

9. Magnetic recording media as in claim 1, wherein the substrate comprises a disk defining a circumferential direction and a radial direction, and wherein a ratio of circumferential coercivity to radial coercivity of the recording media is in the range between about 0.95 and 1.10.

10. Magnetic recording media as in claim 1, further comprising a protective layer including C disposed over the magnetic layer and a lubricating layer over the protective layer.

11. Magnetic recording media comprising:
    a substrate disk defining a circumferential direction and a radial direction;
    an NiP layer disposed over a textured surface imposed over the substrate;
    an underlayer disposed over the NiP layer, the underlayer including an alloy of Cr, Ti in the range between about 2% and 20%, and a material selected from the group consisting of Cu in the range between about 2% and 6% and V in the range between about 5% and 25%; and
    a magnetic layer disposed over the underlayer, the magnetic layer including materials selected from the group consisting of CoCrTaPtB, CoCrTaPtNi, and CoCrTaPtW;
    wherein a ratio of circumferential coercivity to radial coercivity of the recording media is in the range between about 0.8 and 1.25.

12. A method for producing magnetic recording media, the method comprising:
    texturing a surface over a rigid substrate, the substrate comprising a disk defining a circumferential direction and a radial direction;
    minimizing crystal lattice mismatch between an underlayer and a magnetic layer by selecting an alloy of CrTiX;
    forming the underlayer comprising the alloy of CrTiX over the textured surface, wherein the forming step comprises sputtering from a source comprising Ti in the range between about 2% and 20% and X comprising an element selected from the group consisting of Cu in the range between about 2% and 6% and V in the range between about 5% and 25%; and
    forming the magnetic layer over the underlayer;
    wherein the underlayer is adapted to compensate for texture induced anisotropy so that a ratio of circumferential coercivity to radial coercivity of the recording media is in the range between about 0.8 and 1.25.

13. A method as in claim 12, wherein the underlayer forming step comprises sputtering from a source substantially composed of a material selected from the group consisting of CrTiCu and CrTiV.

14. A method as in claim 12, further comprising forming an NiP layer over the substrate, and wherein the texturizing step comprises imposing a texture on the NiP layer.

15. A method for producing magnetic recording media, the method comprising:
    texturing a surface over a rigid substrate, the substrate comprising a disk;
    forming an underlayer over the textured surface, the underlayer comprising an alloy of Cr, Ti in the range between about 2.0% and 20.0%, and an element selected from the group consisting of Cu in the range between about 2.0% and 6.0% and V in the range between about 5.0% and 25.0%; and
    forming a magnetic layer over the underlayer;
    whereby the underlayer enhances overwrite and non-linear transition shift performance of the magnetic layer.

* * * * *